United States Patent [19]

Kasper

[11] 4,295,923

[45] Oct. 20, 1981

[54] METHOD OF MANUFACTURING A SEMICONDUCTOR/GLASS COMPOSITE MATERIAL

[75] Inventor: Erich Kasper, Senden, Fed. Rep. of Germany

[73] Assignee: Licentia Patent-Verwaltungs-G.m.b.H., Frankfurt am Main, Fed. Rep. of Germany

[21] Appl. No.: 130,122

[22] Filed: Mar. 13, 1980

[30] Foreign Application Priority Data

Mar. 14, 1979 [DE] Fed. Rep. of Germany ....... 2909985

[51] Int. Cl.[3] .......................................... H01L 21/306

[52] U.S. Cl. ...................................... 156/630; 29/572; 29/580; 29/590; 156/308.2; 156/633; 156/657; 156/662; 252/79.5; 357/30

[58] Field of Search ................ 29/589, 590, 572, 580; 156/630, 633, 636, 903, 662, 657, 89, 154, 297, 308.2; 252/79.5; 357/29-32; 430/5, 311, 321; 428/428, 446, 620, 630, 632

[56] References Cited

U.S. PATENT DOCUMENTS

| | | | |
|---|---|---|---|
| 3,397,278 | 8/1968 | Pomerantz | 156/272 X |
| 3,951,707 | 4/1976 | Kurtz et al. | 430/317 X |
| 4,069,094 | 1/1978 | Shaw | 156/657 X |

*Primary Examiner*—William A. Powell

*Attorney, Agent, or Firm*—Spencer & Kaye

[57] ABSTRACT

In a method of manufacturing a semiconductor/glass composite material, a glass substrate is covered partially by a covering layer, a semiconductor is connected by pressure and heat to the surface of the substrate not covered by the covering layer, and the semiconductor is then etched away by means of etch polishing to the thickness of the covering layer. The covering may be silicon dioxide, and may be applied to substrate by sputtering or by deposition from the gas phase. The etching solution is $NH_4OH$ and $H_2O_2$ in the ratio 700 to 1.

The composite material may be used as a photocathode in an image converter or image intensifier tube.

5 Claims, 2 Drawing Figures

METHOD OF MANUFACTURING A SEMICONDUCTOR/GLASS COMPOSITE MATERIAL

BACKGROUND OF THE INVENTION

The invention relates to a method of manufacturing a semiconductor/glass composite material in which at least one semiconductor layer is permanently connected to a plate-shaped glass substrate.

A method of manufacturing a semiconductor/glass composite material in which the semiconductor layer has a relatively small thickness is already known per se. In known methods the semiconductor component of the semiconductor/glass composite material was arranged in several layers by means of successive epitaxial processess. After the connection process between the semiconductor and the glass substrate surplus layers of semiconductor were then etched away by means of selective etching agents. The etching process is interrupted automatically once a layer of semiconductor stopping etching has formed. One disadvantage of this known method lies in that the first instance a multi-layer semiconductor body has to be produced in additional operations, the said multi-layer semiconductor body having a layer which stops etching and interrupts the etching process once a certain prescribed minimum thickness of the semiconductor body has been reached.

SUMMARY OF THE INVENTION

The object underlying the present invention is to provide a method which facilitates manufacture of a semiconductor/glass composite material having a semiconductor component of very small thickness.

This object is achieved by covering the glass substrate at least partially by a second layer on its surface facing the semiconductor; bringing the semiconductor and the glass substrate into contact in the surface areas not provided with the second layer; connecting them by means of the action of pressure and heat; and etching away the semiconductor layer to the thickness of the second layer by means of etching polishing.

The method in accordance with the invention makes it possible to manufacture a semiconductor/glass composite material in which the semiconductor component has a very small thickness. It is particularly advantageous if this type of semiconductor/glass composite material is used as a photocathode in an image converter or an image intensifier tube for example.

BRIEF DESCRIPTION OF THE DRAWINGS

The invention will be described in greater detail below with reference to the drawings, in which.

DESCRIPTION OF THE PREFERRED EMBODIMENTS

Figure 1:
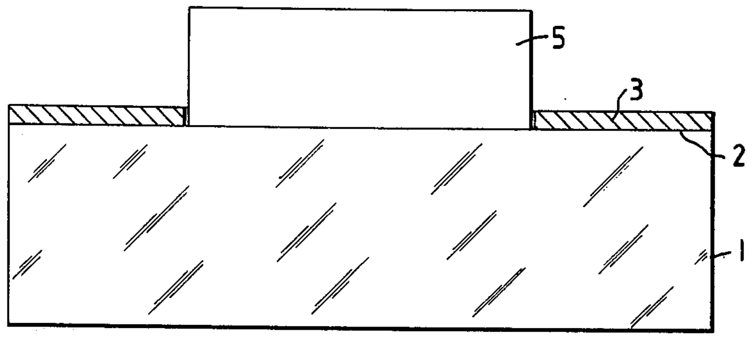
FIG. 1 shows an intermediate step in the method in which a semiconductor is fixed to a glass substrate, the surface of which is covered at least partially with a layer.

In the method in accordance with the invention a relatively thick semiconductor body 5 is brought into contact with a glass substrate 1 for example according to the method proposed in the earlier West German Patent Application No. P 28 42 492.2 and connected thereto by means of the action of pressure and heat. Before joining together the semiconductor 5 and the glass substrate 1 the surface facing the semiconductor 5 of the glass substrate 1 is covered at least partially by a layer 3. This layer 3 should cover all of those areas of the surface 2 of the glass substrate 1 which are not brought into connection with the semiconductor layer 5. This may be achieved for example by applying the layer 3 by means of sputtering while the parts of the surface 2 provided for connection to the semiconductor 5 are covered by a suitable mask.

In an alternative embodiment of the invention however the surface 2 of the glass substrate 1 may in the first instance be covered by a coherent layer 3 which is produced for example by deposition from the gas phase. In a subsequent etching process the areas of the surface 2 provided for the connection process with the semiconductor 5 are exposed again in a manner known per se. The layer 3 is manufactured for example from silicon dioxide ($SiO_2$).

After terminating the connection process between the semiconductor 5 and the glass substrate 1 the semiconductor 5 is initially lapped to approximately 50 microns in thickness. In a subsequent polishing process the thickness of the semiconductor 5 is further reduced until the thickness of the semiconductor 5 corresponds to the thickness of the layer 3. In the method according to the present invention, an etch polishing method is used. The etching process is automatically interrupted if the semiconductor 5 is eroded up to a thickness which corresponds to the layer 3.

Figure 2:
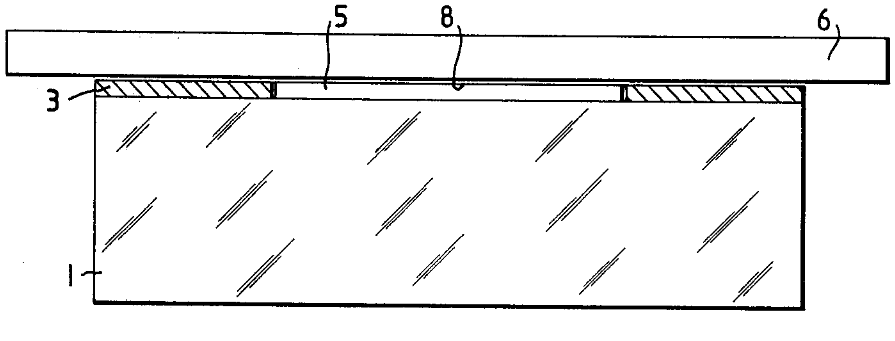
FIG. 2 shows a glass substrate supporting a semiconductor layer in which the semiconductor layer is etched away to the thickness of the layer applied to the surface of the glass substrate.

In a refinement of the invention a 3-micron thick layer 3 comprising a silicon dioxide is applied first of all to a substrate of 6 millimeters in thickness comprising a glass of the ZKN7 type. A semiconductor layer 5 having a thickness of approximately 250 microns and comprising gallium arsenide doped with zinc is then brought into connection with parts of the surfaces of the glass substrate 1 not covered by a layer 3 and is connected to the glass substrate 1 by means of the action of pressure and heat. The thickness of the semiconductor 5 is subsequently reduced to approximately 50 microns by a lapping process. The semiconductor layer 5 is then treated with a polishing cloth 6 (FIG. 2) which is impregnated with an etching solution comprising $NH_4OH$ and $H_2O_2$ until its thickness is reduced to the thickness of the layer 3 by the polishing process (FIG. 2). The layer 3 acts therefore as a layer stopping polishing. This means that the polishing process is terminated when the surface 8 (FIG. 2) of the polished semiconductor layer 5 is in the same plane as the surface of the layer 3. By appropriately dimensioning the thickness of the layer 3 which may be checked relatively easily during the sputtering process or during deposition from the gas phase, the preferably small thickness of the semiconductor layer designed for optical applications, for example as a photocathode, may be achieved simply. A mixture of $NH_4OH$ and $H_2O_2$ in a ratio of 1 milliliter to 700 milliliters is preferably used as the etching solution.

It will be understood that the above description of the present invention is susceptible to various modifications changes and adaptions.

I claim:

1. A method of manufacturing a semiconductor/glass composite material, in which at least one semiconductor layer is permanently connected to a plate-shaped glass substrate comprising the steps of covering the glass substrate at least partially by a second layer on its surface facing the semiconductor; bringing the semiconductor and the glass substrate into contact in the surface areas not provided with the second layer; connecting them by means of the action of pressure and heat; and etching away the semi-conductor layer to the thickness of the second layer by means of etch polishing.

2. A method according to claim 1, wherein the second layer is manufactured from silicon dioxide.

3. A method according to claim 1, wherein the second layer is applied to the surface of the glass substrate by means of sputtering while the surface region of the surface of the glass substrate which is provided for the connection to the semiconductor is covered by a mask.

4. A method according to claim 1, wherein the second layer is produced by deposition from the gas phase so that the surface of the glass substrate is initially covered over its entire surface by the end second layer and the parts of the surface of the glass substrate which are provided for the connection process to the semiconductor are subsequently exposed by means of an etching process which eliminates the second layer at those points.

5. A method according to claim 1, wherein an etching solution is used to etch away the semiconductor layer to the same thickness as the second layer, the said etching solution containing a mixture of $NH_4OH$ and $H_2O_2$ in a ratio of 1 milliliter to 700 milliliters.

* * * * *